(12) United States Patent
Collins et al.

(10) Patent No.: US 8,747,560 B2
(45) Date of Patent: Jun. 10, 2014

(54) SYSTEM AND METHOD FOR PEDESTAL ADJUSTMENT

(71) Applicant: Applied Materials, Inc., Santa Clara, CA (US)

(72) Inventors: Richard Collins, Santa Clara, CA (US); Kailash Kiran Patalay, Santa Clara, CA (US); Jean Vatus, San Jose, CA (US); Zhepeng Cong, Vancouver, WA (US)

(73) Assignee: Applied Materials, Inc., Santa Clara, CA (US)

( * ) Notice: Subject to any disclaimer, the term of this patent is extended or adjusted under 35 U.S.C. 154(b) by 32 days.

(21) Appl. No.: 13/766,230

(22) Filed: Feb. 13, 2013

(65) Prior Publication Data

US 2013/0152859 A1    Jun. 20, 2013

Related U.S. Application Data

(62) Division of application No. 12/238,921, filed on Sep. 26, 2008, now Pat. No. 8,398,777.

(60) Provisional application No. 61/050,154, filed on May 2, 2008.

(51) Int. Cl.
*C23C 16/00* (2006.01)
*C23C 16/50* (2006.01)
*C23F 1/00* (2006.01)
*H01L 21/306* (2006.01)

(52) U.S. Cl.
USPC ... 118/729; 118/728; 156/345.1; 156/345.51; 156/345.54

(58) Field of Classification Search
USPC ......... 118/715, 728–732; 156/345.51–345.55
See application file for complete search history.

(56) References Cited

U.S. PATENT DOCUMENTS 4,573,791 A   3/1986   Phillips
5,296,916 A   3/1994   Kelly et al.
(Continued)

OTHER PUBLICATIONS

Final Office Action of Jun. 3, 2011 for U.S. Appl. No. 12/238,987, 16 pages.

(Continued)

*Primary Examiner* — Maureen Gramaglia
*Assistant Examiner* — Tiffany Nuckols
(74) *Attorney, Agent, or Firm* — Kilpatrick Townsend & Stockton LLP (57) ABSTRACT

A pedestal positioning assembly system for use in a substrate processing system includes a pedestal rigidly attached to a pedestal shaft, a reference rigidly attached to the substrate processing system, a lateral adjustment assembly to adjust a lateral location of the pedestal relative to the reference, and a vertical adjustment assembly to adjust a tilt of the pedestal relative to the reference. The lateral adjustment assembly and the vertical adjustment assembly are external to a processing chamber and are coupled to the pedestal disposed within the processing chamber through the pedestal shaft. The reference can be a ring and the lateral adjustment assembly substantially centers the pedestal within the ring. A method of adjusting a pedestal includes leveling the pedestal, translating the pedestal, calibrating the pedestal height to a preheat ring level, and checking the level and location of the pedestal while rotating the pedestal.

8 Claims, 9 Drawing Sheets

(56) References Cited

U.S. PATENT DOCUMENTS

| | | |
|---|---|---|
| 6,310,327 B1 | 10/2001 | Moore et al. |
| 2004/0177813 A1* | 9/2004 | Schieve et al. ............... 118/728 |
| 2005/0088636 A1 | 4/2005 | Kurosawa |
| 2005/0149222 A1 | 7/2005 | Kobayashi et al. |
| 2006/0001850 A1 | 1/2006 | Dekker et al. |
| 2008/0017116 A1* | 1/2008 | Campbell et al. ............ 118/729 |
| 2008/0017117 A1 | 1/2008 | Campbell et al. |
| 2009/0272719 A1 | 11/2009 | Collins et al. |
| 2009/0276097 A1 | 11/2009 | Patalay et al. |

OTHER PUBLICATIONS

Final Office Action of Jul. 18, 2012 for U.S. Appl. No. 12/238,921, 13 pages.
Non-Final Office Action of Nov. 23, 2010 for U.S. Appl. No. 12/238,987, 16 pages.
Non-Final Office Action of Aug. 11, 2011 for U.S. Appl. No. 12/238,921, 11 pages.

* cited by examiner

SYSTEM AND METHOD FOR PEDESTAL ADJUSTMENT

CROSS-REFERENCES TO RELATED APPLICATIONS

The application is a divisional of U.S. patent application Ser. No. 12/238,921, filed on Sep. 26, 2008, which claims the benefit of U.S. Provisional Application No. 61/050,154, filed on May 2, 2008, the disclosures of which are incorporated herein by reference in their entirety for all purposes.

BACKGROUND

The application relates generally to semiconductor processing equipment and particularly to measuring the alignment of components located within the semiconductor processing equipment and to adjusting the position of misaligned components within the semiconductor processing equipment.

Semiconductor processing equipment is used in the deposition, patterning, and treatment of thin films and coatings. A conventional semiconductor processing system contains one or more processing chambers and a means for moving a substrate between them. A substrate may be transferred between chambers by a robotic arm which can extend to pick up the substrate, retract and then extend again to position the substrate in a different destination chamber. Each chamber has a pedestal or some equivalent way of supporting the substrate for processing.

A pedestal may supply heat to a substrate during processing. Heat may be provided by a resistive mechanism to a refractory metal coil embedded in the heater plate. The substrate may be held by a mechanical, pressure differential or electrostatic means to the pedestal between when a robot arm drops off the substrate and when an arm returns to pick up the substrate. Lift pins are often used to elevate the wafer during robot operations. When on the pedestal, one or more processes may be performed. These may include annealing the substrate and depositing or etching a film on the substrate.

Most processes provide more benefit when the process uniformity across the substrate surface is higher. One of the parameters which may affect uniformity is the position of the substrate during processing. As a result, processing systems are preferably designed to provide reproducible placement of substrates during processing steps.

An illustrative example of a process and associated process chamber which can suffer from a less than optimal reproducibility in the pedestal and substrate position is epitaxial film growth (often referred to as EPI). Deposited film uniformity (e.g. film thickness and dopant density) in an EPI process, as with many other processes, can be sensitive to tilt and a lateral misalignment of the substrate. The position of the substrate is determined, in part, by the position of the pedestal.

In an EPI process, a portion of the heat supplied to the substrate may come from optical radiation sources which expose the heater plate and/or the substrate to light. This method is also desirable for rapid thermal processing and other processes which benefit from higher substrate temperatures. Substrate processing chambers designed for radiative heating usually use quartz for some portion of the chamber wall because of its ability to tolerate high temperatures, low coefficient of thermal expansion and excellent transparency to infrared and visible light. EPI chambers may employ quartz domes for the top and/or bottom of the chamber to allow the radiation to impact the substrate and pedestal. The pedestals in EPI chambers are often called susceptors because they absorb radiation and provide heat to the substrate.

Figure 1A:
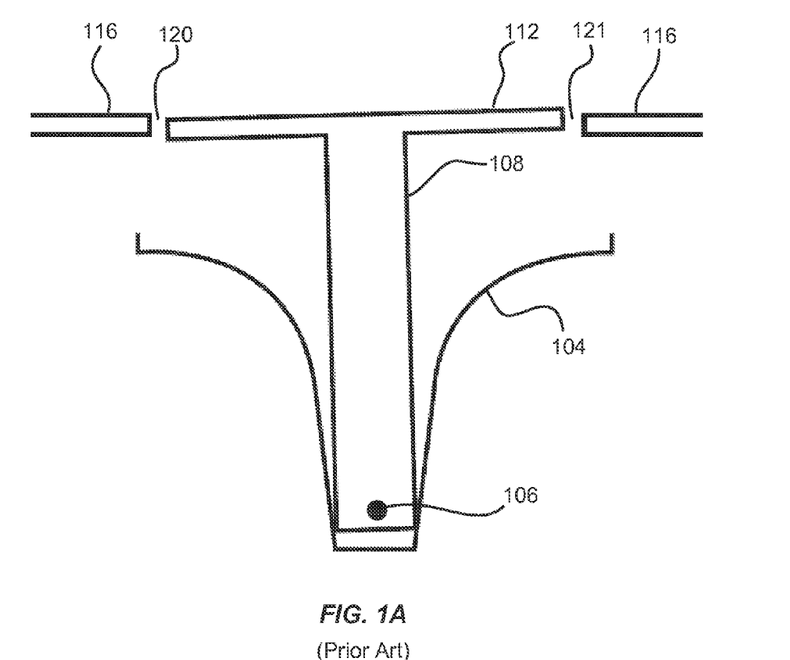
FIG. 1A is a schematic view of a prior art pedestal assembly depicting a tilted pedestal.

These quartz domes may be relied upon for support of interior chamber components like the pedestal, which can be a susceptor. Quartz domes are shaped at high temperatures when the glass is ductile, giving rise to tolerance variabilities. FIG. 1A depicts a schematic view of an EPI chamber. The bottom quartz dome 104 is shown providing support for a shaft 108 and a rigidly affixed pedestal 112, which together may be referred to as a substrate support assembly. The pedestal is shown in FIG. 1A indicating a non-negligible misalignment with a preheat ring 116 upon assembly. The substrate support assembly is tilted about a pivot point 106 with an approximate location indicated near the bottom of the shaft.

Figure 1B:
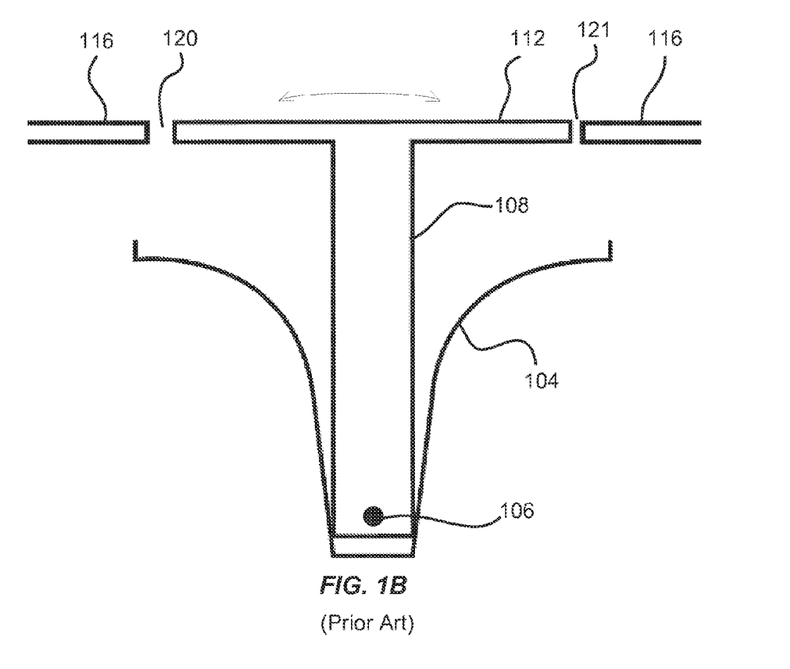
FIG. 1B is a schematic view of a prior art pedestal assembly depicting a pedestal whose tilt has been removed.

A prior art technique for correcting this tilt (i.e. leveling the pedestal) is to apply a force against the shaft 108 above the pivot point 106 to rotate the substrate support assembly clockwise. The net result of this technique is shown in FIG. 1B. The tilt has been corrected, but a lateral offset has been introduced resulting in a non-uniform gap between the pedestal and the preheat ring. Note in this two dimensional depiction, the gap on the left 120 is larger than the gap on the right 121.

In addition to the coupling between the tilt and lateral location, the technique currently used has other drawbacks. The pedestal is adjusted using a manual process that uses a contact straight-edge leveling tool. An operator using the straight-edge may visually judge the pedestal positioning and manually adjust the tilt and/or translation mechanism of the pedestal until visually it appears adequate. The reliance on visual measurement is undesirable as it is subjective, time-consuming and prone to human errors. It also necessitates opening the chamber upper dome requiring the chamber to be vented to atmosphere which brings with it a loss in productivity due to significant down-time and recovery time.

Another drawback to the prior art technique for correcting tilt and lateral location is that the correction is done prior to pumping down the semiconductor processing apparatus. Pumping down a semiconductor processing apparatus can cause components to shift, move or even flex. Components that are aligned prior to pumping down a semiconductor processing apparatus can become unaligned after pumping down. For example, a pedestal that is aligned when the semiconductor processing apparatus is opened can become misaligned for processing conditions because the semiconductor processing apparatus is closed up and pumped down before processing. Therefore, prior art techniques for correcting tilt and lateral location have the drawback that although components can be aligned during the alignment process, those components may become misaligned before or during processing of wafers.

Therefore, a system and method is needed for independently adjusting the tilt and lateral location of a component in a semiconductor processing apparatus while the semiconductor processing system is fully assembled.

BRIEF SUMMARY

Embodiments of the present invention relate to providing a non-contact and in-situ method to precisely measure the pedestal positioning. This measurement is used as a feedback for either manual adjustment or fully automatic closed-loop servo based adjustment of the tilt and translation mechanism until the pedestal is fully level, centered and adjusted for height. The non-contact method allows the measurement to be done in vacuum thus eliminating the need for the chamber to be open and vented significantly minimizing any down-time and recovery time.

Embodiments of the present invention provide techniques for measuring and adjusting the location and tilt of components in a semiconductor processing system while the semiconductor processing system is fully assembled and under vacuum.

In embodiments of the present invention, a pedestal assembly positioning system is used to adjust the location and tilt of components in a semiconductor processing system. The pedestal assembly positioning system includes a pedestal supported by a pedestal shaft, an inner ring, a lateral adjustment assembly, and a vertical adjustment assembly. The inner ring is rigidly attached to the pedestal and is nearly concentric with a reference ring located on the substrate processing system. The lateral adjustment assembly is constructed so the lateral location of the pedestal relative to the outer ring of the processing system is adjustable. Similarly, the vertical adjustment assembly is constructed so the tilt of the pedestal relative to the outer ring assembly of the processing system is adjustable. The lateral adjustment assembly and vertical adjustment assembly are coupled to the pedestal through the pedestal shaft.

In another embodiment the pedestal is a susceptor.

In yet another embodiment, the lateral adjustment assembly includes three adjustment screws nearly equally spaced around the outer ring. The three adjustment screws can have two regions with different thread pitches to produce a reduced apparent thread pitch.

In yet another embodiment, the pedestal assembly positioning system further includes a bellows to maintain a pressure difference between the inside and outside of the processing system while adjusting the adjustment screws.

In yet another embodiment, the pedestal assembly positioning system further includes a locking mechanism. The locking mechanism can include four locking screws.

In another embodiment, a substrate processing system includes a processing chamber, a pedestal, an optical measurement assembly, a lateral adjustment assembly and a vertical adjustment assembly. The processing chamber includes a fixed reference object located inside the processing chamber. A portion of the processing chamber is transparent. The pedestal for supporting a work piece can be located within the processing chamber. The optical measurement assembly is coupled to the exterior of the processing chamber. The optical measurement assembly measures the location and tilt of the pedestal by transmitting light into the chamber through the transparent portion of the chamber and detecting reflected light after the reflected light leaves the chamber through the transparent portion of the chamber. The fixed reference object inside the processing chamber and a portion of the pedestal are positioned so that they can be exposed to light from outside of the processing chamber through the transparent portion of the chamber. The lateral adjustment assembly can adjust the lateral location of the pedestal relative to the fixed reference object and the vertical adjustment assembly can adjust the height and tilt of the pedestal relative to the fixed reference object. The lateral adjustment assembly and the vertical adjustment assembly are outside of the processing chamber and are coupled to the pedestal through a pedestal shaft that is coupled to the processing chamber through a bellows.

In yet another embodiment, the portion of the processing chamber that is transparent is a quartz dome or a view port.

In yet another embodiment, the fixed reference object in the processing chamber is an outer ring rigidly attached to the processing chamber.

In yet another embodiment, the pedestal further includes an inner ring that is rigidly attached to the pedestal and is nearly concentric with the outer ring.

In yet another embodiment, the pedestal used in the substrate processing system is a susceptor.

In yet another embodiment, the lateral adjustment assembly used in the substrate processing system includes three adjustment screws nearly equally spaced around the outer ring. The bellows can maintain a pressure difference between the inside and outside of the substrate processing system while adjusting the adjustment screws.

In yet another embodiment, the substrate processing system further includes a locking mechanism for securing the pedestal in place. The locking mechanism can include four locking screws.

In yet another embodiment, a method of adjusting a position of a pedestal assembly includes measuring the tilt and location of the pedestal relative to a processing system reference, leveling the pedestal in response to the tilt measurement to reduce the tilt of the pedestal relative to the processing system reference, translating the pedestal to be at a predetermined location in response to the location measurement without significantly affecting the tilt. The processing system reference is rigidly attached to a processing system and can be a preheat ring. The pedestal can be a susceptor.

In yet another embodiment, the step of leveling is done before the step of translating.

In yet another embodiment, the method of adjusting a position of a pedestal further includes adjusting the height of the pedestal to a predetermined level without significantly affecting the tilt.

In yet another embodiment, the step of measuring the location of the pedestal further includes reflecting light from a plurality of locations around the pedestal and the processing system reference and analyzing the reflected light to determine an indication of location of the pedestal relative to the processing system reference at the plurality of locations. The indication of location can be a difference in height between the pedestal and the processing system reference. Alternatively, the indication of location can be a separation between an outer edge of the pedestal and an inner edge of the processing system reference.

In yet another embodiment, reflecting light from a plurality of locations includes reflecting light from at least two locations to determine whether the pedestal is centered within the processing system reference.

In yet another embodiment, reflecting light from a plurality of locations includes reflecting light from at least three locations to determine the height and lateral location of the pedestal.

In yet another embodiment, reflecting light from a plurality of locations includes reflecting light from at least three locations to determine the tilt of the pedestal.

In yet another embodiment, analyzing the reflected light further includes calculating the tilt angle from a height difference between the two markers.

In yet another embodiment, the step of leveling the pedestal to reduce the tilt of the pedestal further includes adjusting the tilt of the pedestal so that the angle between a surface on the pedestal and the processing system reference is less than or equal to 0.15 degrees.

In yet another embodiment, the step of positioning the pedestal further includes maintaining the angle between a surface on the pedestal and the processing system reference to be less than or equal to 0.15 degrees, adjusting the horizontal location of the pedestal to be within 0.5 mm of the predetermined location, verifying that the angle between a surface on the pedestal and the processing system reference is less than or equal to 0.15 degrees after the adjustment, and securing the position of the pedestal by locking the pedestal into place.

In yet another embodiment, the step of positioning the pedestal further includes maintaining the angle between a surface on the pedestal and the processing system reference to be less than or equal to 0.15 degrees, adjusting the horizontal location of the pedestal to be within 0.5 mm of the predetermined location, adjusting the height of the pedestal to be within 0.3 mm of the predetermined location, verifying that the angle between a surface on the pedestal and the processing system reference is less than or equal to 0.15 degrees after the adjustments, and securing the position of the pedestal by locking the pedestal into place.

In yet another embodiment, the method of adjusting a position of a pedestal further includes checking the level and location of the pedestal while rotating the pedestal. Checking the level and location of the pedestal while rotating the pedestal can include checking that the angle between a surface on the pedestal and the processing system reference is less than or equal to 0.5 degrees and that the horizontal location of the pedestal is within 1.0 mm of the predetermined location.

In yet another embodiment, a method of processing a substrate in a substrate processing system includes pumping a process chamber with a pedestal inside to a pressure less than 80 torr, measuring the tilt and location of the pedestal relative to a processing system reference, leveling the pedestal in response to the tilt measurement to reduce the tilt of the pedestal relative to the processing system reference, and translating the pedestal to be at a predetermined location in response to the location measurement without significantly affecting the tilt. The processing system reference can be rigidly attached to the substrate processing system.

In yet another embodiment, the method of processing a substrate in a substrate processing system further includes checking the level and location of the pedestal while rotating the pedestal. Checking the level and location of the pedestal while rotating the pedestal can include checking that the angle between a surface on the pedestal and the processing system reference is less than or equal to 0.5 degrees and that the horizontal location of the pedestal is within 1.0 mm of the predetermined location.

BRIEF DESCRIPTION OF THE DRAWINGS

A further understanding of the nature and advantages of the invention may be realized by reference to the remaining portions of the specification and the drawings, presented below. The Figures are incorporated into the detailed description portion of the invention.

DETAILED DESCRIPTION

Aspects of embodiments disclosed herein are used to improve the performance of substrate processing systems by improving uniformity and repeatability of the process running on the substrate processing system. The uniformity and repeatability of processes are impacted by the location and levelness of the pedestal supporting the substrate being processed. Embodiments of the present invention relate to measuring the pedestal and/or substrate tilt and location relative to a fixed reference and adjusting the tilt and location of the pedestal and/or substrate. Measurements are performed using a non-contact and in-situ methods to precisely measure the pedestal and/or substrate tilt and location. This measurement is used as a feedback for either manual adjustment or automatic closed-loop servo based adjustment of the tilt and translation mechanism until the pedestal is level, centered and adjusted for height. The non-contact method allows the measurement to be done in vacuum thus reducing the need for the chamber to be open and vented significantly minimizing any down-time and recovery time. A feature of disclosed embodiments involves the capability of decoupling the adjustment of the tilt of a pedestal and its lateral location in the XY plane. Another feature of disclosed embodiments involves the capability of making adjustments while a substrate processing system is fully assembled and possibly under vacuum.

Properties of disclosed embodiments will often be described herein with particular relevance to high temperature substrate processing systems which possess a known acute need for benefits of the disclosed embodiments. However, other processing equipment in use now and those not yet developed may also benefit from the disclosed embodiments as well.

An exemplary process and associated process chamber will be used as a vehicle to disclose embodiments in this disclosure. The exemplary process is epitaxial film growth (a.k.a. EPI) and is known to be prone to irreproducibility of pedestal and substrate position. The irreproducibility can be found when matching a process from one system to another or when qualifying a process after any procedure which necessitates reassembly. Particular aspects of the film which may vary based on substrate placement include (but are not limited to) film thickness, impurity/dopant density and crystal defectivity. Variation of these fundamental aspects can result in changes in other thin film metrics like electrical, magnetic and physical characterizations. These variations can be between a first wafer and a second wafer, each processed at different positions and/or within a wafer which could be caused by a tilted or poorly centered wafer.

A reference object within a process chamber should be defined in order to measure the height, lateral placement (also referred to herein as centrality), and tilt of a pedestal or substrate. This may be a gas distribution plate above a wafer in a plasma chemical vapor deposition process or a target in a physical vapor deposition process or a reference ring. In an EPI process the tilt and height are measured relative to a reference ring which is a preheat ring like the ones described in FIGS. 1A and 1B. A silicon-containing gas is flowed over the preheat ring and over the substrate where deposition occurs. EPI processing chambers, like some other processing chambers, rotate a circular substrate (also called a wafer) during deposition to improve uniformity. Substrates can include glass, ceramics, metals or other work pieces including wafers.

Preheating the gas in this way can, for example, increase the deposition rate near the edge of a wafer. If the preheat ring is held at too low a temperature or the height of the preheat ring is too high in comparison with the deposition surface of the wafer, the silicon film grown on the substrate may have a reduced thickness near the edge. When depositing on a wafer that is rotated during deposition, these effects can result in an undesirably large edge exclusion (greater than two or three millimeters). In other words, the chips formed near the edge of the wafer would not have optimized properties or may not function. Even if the height is correct and there is no tilt, a lateral placement error of the wafer in the plane of the preheat ring will create a variation in the gap 120,121 between the preheat ring 116 and the wafer pedestal 112. Rotating the wafer during deposition may create a rotationally symmetric deposition, but the uniformity of the film, especially near the edge, may still be impacted.

Figure 2A:
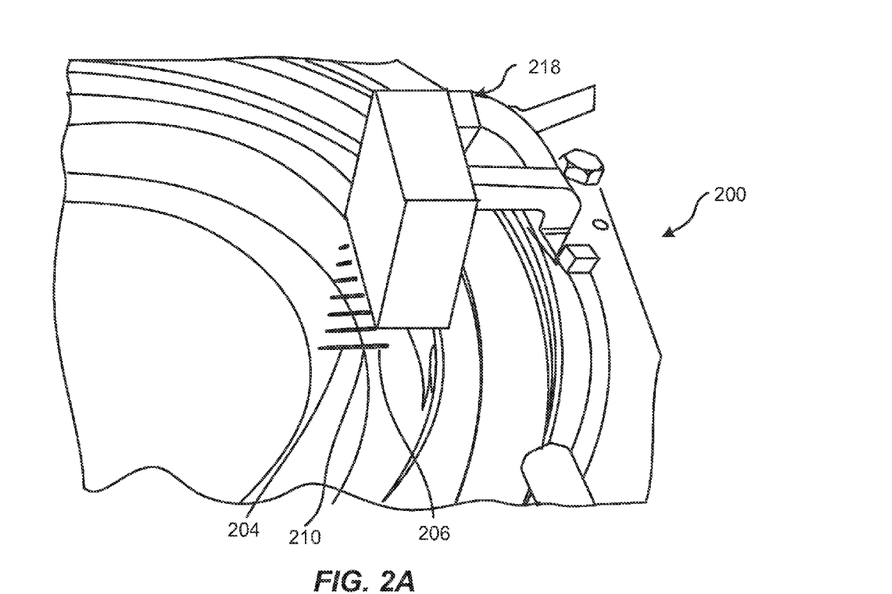
FIG. 2A is a perspective view of an optical measurement assembly positioned above a processing chamber according to an embodiment of the invention.

FIG. 2A illustrates an EPI processing system 200 having a quartz dome with an optical measurement assembly used to measure the location and tilt of a work piece, or other component, located within the EPI processing system 200, in accordance with an embodiment of the invention. The EPI processing system 200 includes a pedestal 204, and a preheat ring 206 that is separated from the pedestal 204 by a gap 210. The pedestal 204 can be a susceptor or wafer supporting structure. The optical measurement assembly includes a laser gauge 218 which is used to supply and detect light that reflects from the pedestal 204, preheat ring 206, wafer (not shown) or other components located within the EPI processing system 200. Optical measurements of the pedestal 204, preheat ring 206, wafer (not shown) or other components located within the EPI processing system 200 are made by shining light from the laser gauge 218 through the quartz dome. With these measurements, relative positions between the components, such as the location of the wafer relative to the preheat ring, can be determined. During operation, a sheet of light is reflected from the pedestal 204 and the preheat ring 206, while some of the light enters the gap between the two 210. Although the light source used in this embodiment is a laser, those skilled in the art will recognize that the light source can be any source that produces a collimated light. In this embodiment, measurements are performed on the pedestal 204, preheat ring 206, wafer (not shown) or other components located within the EPI processing system 200, while the EPI processing system 200 is fully assembled and is under vacuum or at the processing pressure. The quartz dome, which is located between the laser gauge 218 and the two reflecting surfaces (the pedestal 204 and the preheat ring 206), allows light to pass through so that optical measurements can be done on components located within the EPI processing system 200.

Figure 2B:
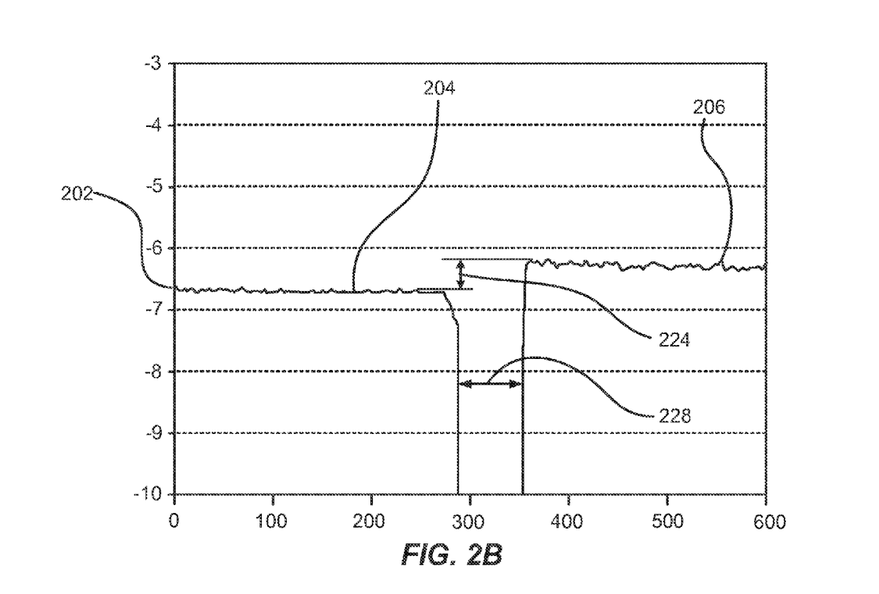
FIG. 2B is a height profile determined with an optical measurement assembly according to an embodiment of the invention.

In order to better understand and appreciate disclosed embodiments, reference is now made to FIG. 2B, which is a linear distribution of height measurements 202 including the height of the pedestal 204 and the preheat ring 206 at one location along the circumference of the pedestal 204. The sequence of height measurements can be used to calculate a height difference 224 between the pedestal and the preheat ring. The sequence can also be used to calculate the gap 228 between the outer surface of the pedestal and the inner surface of the preheat ring. A variety of optical measurement assemblies can be used to produce the height and/or gap measurements of FIG. 2B, including illuminating the line of measurement sites from an angle and measuring the location of the specularly reflected light with a two dimension optical detector.

The measurement represented in FIG. 2B can be repeated around the pedestal at three or more locations around the circumference of the pedestal in order to calculate the pedestal height, tilt (magnitude and direction) and centrality (magnitude and direction). Measurements are repeated and adjustments are made until the height difference 224 at three or more different locations around the pedestal are within a predetermined tolerance and the average of the three height differences is substantially close to a predetermined value. The height can be corrected with a linear vertical translation generated manually or with a motor.

Figure 3:
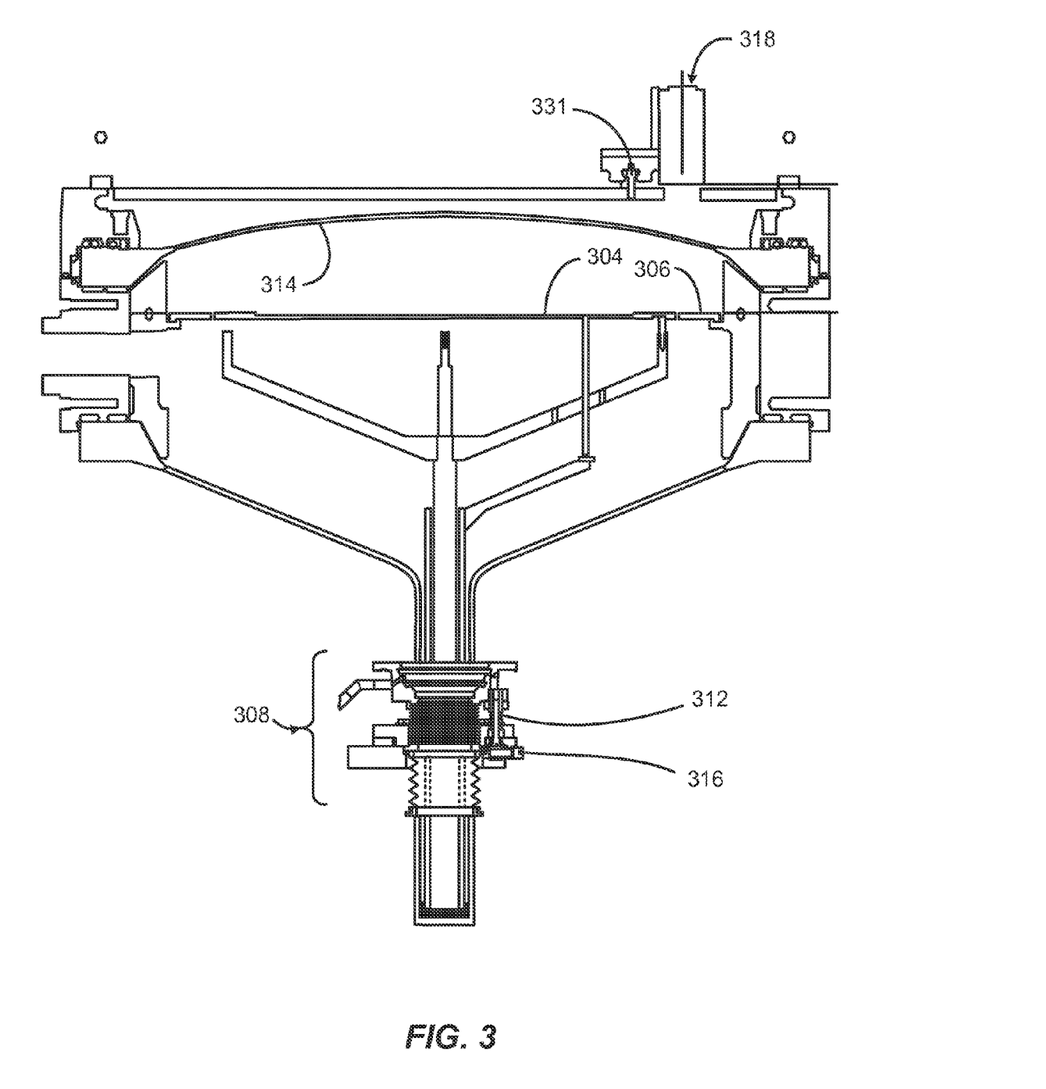
FIG. 3 is a view of a substrate processing system with a non-contact position sensing system and a positioning assembly according to an embodiment of the invention.

The three measurements can be made by placing three or more optical measurement assemblies around the circumference of the chamber in some embodiments, thereby enabling the measurements to be made simultaneously. In alternative embodiments, fewer optical measurement assemblies can be used and some can be relocated between measurements to secure enough measurement sites. An optical measurement assembly may be mounted on a translation stage, enabling measurements to be made at different locations within the processing chamber without human intervention. FIG. 3 shows a cross-section of an optical measurement assembly 318 mounted on a guide rail 331 which guides the optical measurement assembly 318 during translation. In embodiments, the guide rail 331 may be curved so the optical measurement assembly 318 (moving above the quartz dome 314) may be positioned to make measurements at multiple locations around the edges of the susceptor 304 and preheat ring 306. In still further embodiments, a support arm moves the optical measurement assembly 318 without requiring a guide rail, adjusting position with two axes of motion allowing flexibility in placement of the assembly. The optical measurement assembly 318 may, alternatively, be moved on a rotary hinge so the position of the assembly is adjustable around the edges of the susceptor 304 and preheat ring 306 in a manner similar to the curved guide rail 331. Use of a rotary hinge and/or a guide rail reduce the degrees of freedom in the motion of the optical measurement assembly 318 which improves the accuracy and repeatability of the placement of the measurement assembly 318. Accurate and repeatable placement is important for some of measurement techniques described below.

Processing chambers which do not have quartz domes can also be used in alternative embodiments. Viewports with diameters sufficiently large to make one or more measurements need to be installed on the processing chamber. For example, three quartz viewports may be positioned on the top of a processing chamber with an angular separation of about 120° to enable three measurements to guide tilt and centrality adjustments. Different essentially transparent viewports may also be used employing alternative transparent materials; different angular separations are present in some disclosed embodiments.

In an alternative optical measurement assemblies, two light beams are focused down and reflected, one from the pedestal and one from the preheat ring, and each then directed towards one or more CCD or CMOS array detector(s). The detector(s) can be one or two dimensional and is (are) used to determine or infer the sizes of the reflected beam at the detector. These sizes can then be assigned a height value and the height can be calculated with an analytic approximation or retrieved from a look-up table. This measurement procedure can also be done, in embodiments, by reflecting two collimated beams from the pedestal and preheat ring and determining the size of the reflected beam as above. This method is called optical triangulation and relies on properties of the two surfaces, which are characterized before a measurement, to widen the beam at a precharacterized rate.

A variety of other more involved optical techniques may be used as well. In some embodiments, the techniques may rely on interferometry, the phase shift method or other time-of-flight techniques. Additionally, acoustic sources and sensors can be used in a variety ways, employing some of the same principles described previously with respect to optical methods. In this case, the measurements should be made through an acoustically transmissive material such as the quartz domes often used in EPI reactors. Signal processing techniques may be needed to suppress background signal and accentuate the sound returning from the susceptor or preheat ring. The background signal may include contributions from a reflections occurring at other material interfaces (e.g. air-quartz) but may also arise from the large spot sizes often needed for acoustic methods.

The advantages of measuring and adjusting the height, tilt and centrality of the pedestal originate from the sensitivity of the process to the position of the wafer and the high probability that the position of the wafer will vary with the position of the pedestal. As such, disclosed optical measurement assemblies can be used to make the measurements with the wafer in place instead of measuring the position of the pedestal. This can result in additional useful information since the measurement is being made at the deposition surface.

At least three spatially separated measurements are needed for a determination of height or tilt. Since the outer diameter of the pedestal and the inner diameter of the preheat ring are known, two measurements are sufficient to determine the lateral location or centrality of the pedestal. In one disclosed embodiment, tilt is adjusted first, followed by the height and then the centrality. In another embodiment, height is adjusted first, followed by the tilt and then the centrality. Although other orders are possible, in the preferred embodiment the tilt should be adjusted before the centrality since the tilt adjustment can affect centrality. The centrality adjustment, using the methods discussed herein, can be done without affecting the tilt. During the adjustment of the centrality, measurements can be repeated and adjustments made until the gap 228 at multiple locations are within a specific tolerance of a predetermined gap.

Adjusting the gap may be done in a way that does not significantly affect the tilt. In order to realize such an independence, separate mechanisms are employed for leveling the substrate support assembly and for translating the substrate support assembly. Leveling the substrate support assembly adjusts the tilt of the substrate support assembly so that it is level with respect to a reference. Translating the substrate support assembly moves the substrate support assembly so that it may be centered both horizontally and vertically with respect to a reference. FIG. 3 is a side view of the substrate processing system with a pedestal 304 and a positioning assembly 308. The positioning assembly 308 includes both a vertical adjustment assembly portion and a lateral adjustment assembly portion. The vertical adjustment assembly portion includes vertical screws 312 for height and tilt adjustments while the lateral adjustment assembly portion includes horizontal screws 316 to adjust the lateral placement (centrality). Tilting the pedestal 304 with the vertical screws can affect the lateral placement (centrality) of the pedestal 304. In other words, adjusting the tilt of the pedestal 304 can cause changes in the lateral placement (centrality) of the pedestal 304. The horizontal screws 316 of the positioning assembly 308 are used to correct the centrality of the pedestal 304 without significantly affecting the tilt of the pedestal 304.

Figure 4A:
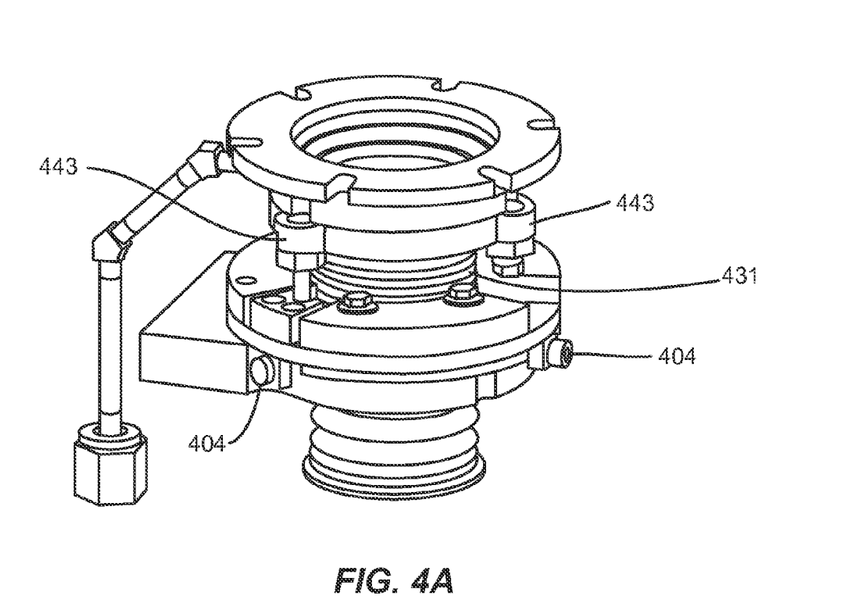
FIG. 4A is a perspective view of a positioning assembly according to an embodiment of the invention.
Figure 4B:
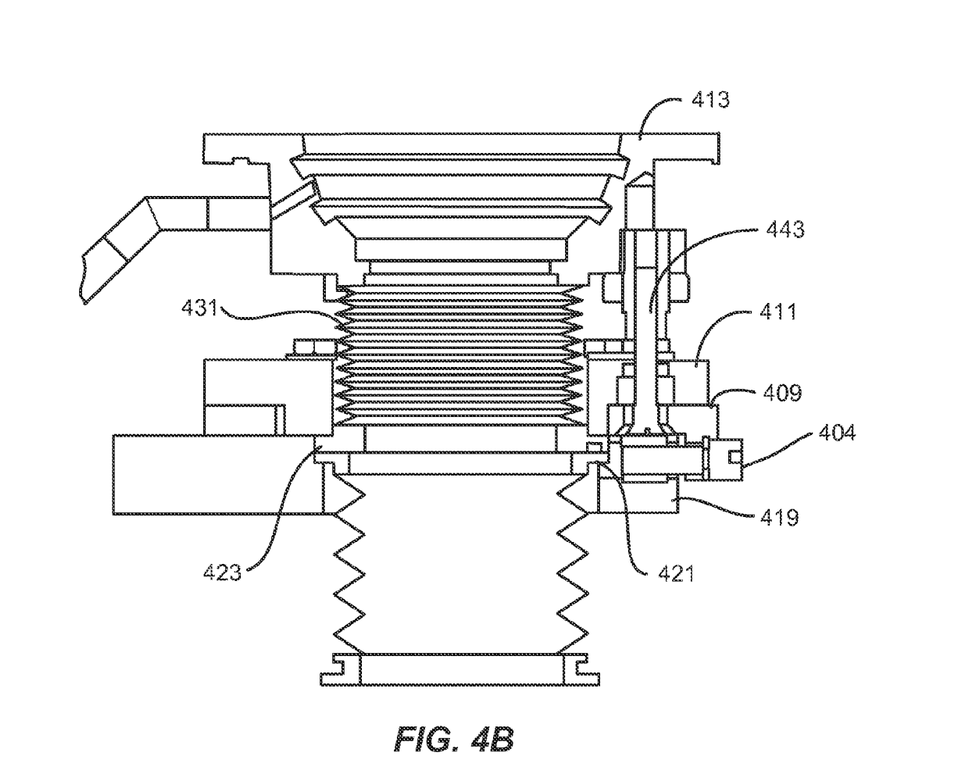
FIG. 4B is a cross-sectional view of a positioning assembly according to an embodiment of the invention.

FIGS. 4A and 4B are views of the positioning assembly 308, which is discussed above with reference to FIG. 3. FIG. 4A is a perspective view the positioning assembly 308 including three lateral adjustment screws 404 (two shown), a bellows 431, three vertical adjustment screws 443 (two shown). One of the three screws 443 may be a post if height is to be adjusted with a separate assembly. FIG. 4B is a cross-sectional view of the positioning assembly 308 including the three lateral adjustment screws 404 (one shown), an outer stationary ring 409, a first stationary flange 411, a second stationary flange 413, an adjustable support ring 419, a first mobile flange 421, a second mobile flange 423, a bellows 431, and the three vertical adjustment screws 443 (one shown). The positioning adjustments of the pedestal 304 are made by the positioning assembly 308. The lateral location of the shaft and pedestal may be adjusted using three lateral adjustment screws 404, such that the gap between the pedestal and preheat ring, discussed above with reference to FIG. 2, is uniform all around the circumference. In an embodiment, each 404 of the three lateral adjustment screws are separated by 120°. The tilt of the pedestal remains essentially unaffected during the adjustment of the lateral adjustment screws 404. This is made possible because the lateral adjustment screws 404 apply forces to an adjustable support ring 419 relative to an outer stationary ring 409. The outer stationary ring is rigidly coupled to the stationary flanges (411, 413) and the outer portion of the processing chamber. Therefore the adjustable support ring 419 can be moved laterally along with mobile flanges (421, 423) and components below these two flanges. Since the adjustment of the lateral adjustment screws 404 move the components below the adjustable support ring 419 en masse, and the substrate support assembly is attached at the bottom of its support shaft, the orientation of the shaft is maintained and no tilt is imparted. Enabling this motion is the bellows 431, which flexes as adjustments are made. The presence of a bellows 431 also enables the processing chamber to be maintained at a pressure different from atmospheric pressure even during the adjustment.

The lateral adjustment screws 404 can be turned to cause lateral displacement of the pedestal 304 using different embodiments of operation as illustrated in FIGS. 4C-4F.

Figure 4C:
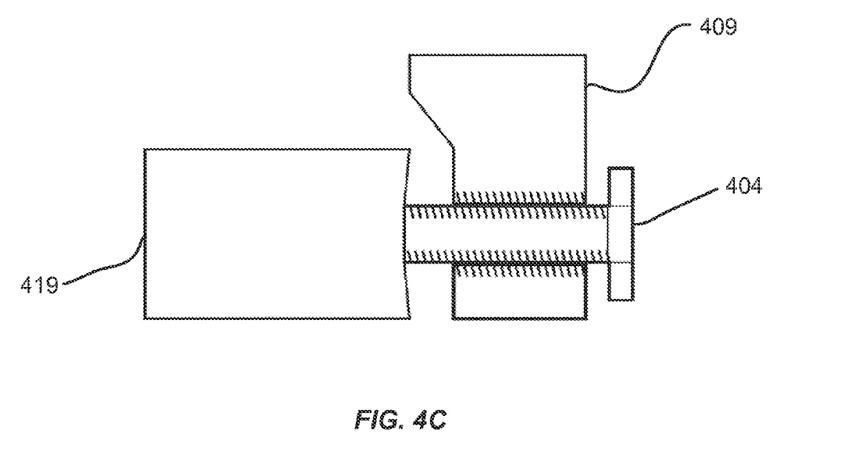
FIG. 4C is a schematic view of a portion of a positioning assembly according to an embodiment of the invention.

FIG. 4C illustrates an embodiment where lateral adjustment screws 404 are used to push the adjustable support ring 419 locally away from the outer stationary ring 409. Before the adjustable support ring 419 can be moved by a first screw, the complementary screws of the positioning assembly may be unscrewed or "backed off" to allow the necessary amount of motion by the adjustable support ring 419. After backing them off, the first screw can be used to push the adjustable support ring 419 in the preferred direction. In disclosed embodiments, there are one or more of other screws, called set screws, which are screwed in to hold the substrate support assembly in place once the pedestal is in the proper location. There may be one, two, three, four or more set screws in different disclosed embodiments.

Figure 4D:
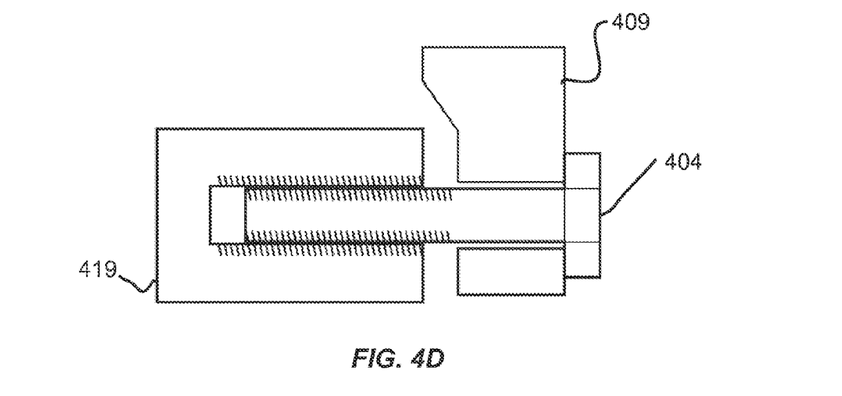
FIG. 4D is a schematic view of a portion of a positioning assembly according to an embodiment of the invention.

FIG. 4D illustrates another embodiment where the lateral adjustment screws 404 pull the adjustable support ring 419 toward the outer stationary ring 409. In the embodiment shown, turning the screw clockwise for right-handed threads results in a decrease in the separation of the adjustable support ring 419 and the outer stationary ring 409. Analogously to the pushing configuration of FIG. 4C, the complementary screws of the positioning assembly may be unscrewed or "backed off" to allow the necessary amount of motion by the adjustable support ring 419.

The ability to fine-tune the centrality of the pedestal with the two embodiments represented by FIGS. 4C and 4D is determined, in part, by the thread pitch of the bolts and threaded holes. Creating a tighter thread pitch to increase the ability to control the lateral location of the pedestal introduces a higher risk of damaging the threads during tuning operations. To address this issue, an additional mode of operating the screws is disclosed with reference to FIGS. 4E and 4F but can be implemented in a variety of analogous designs with similar functions.

Figure 4E:
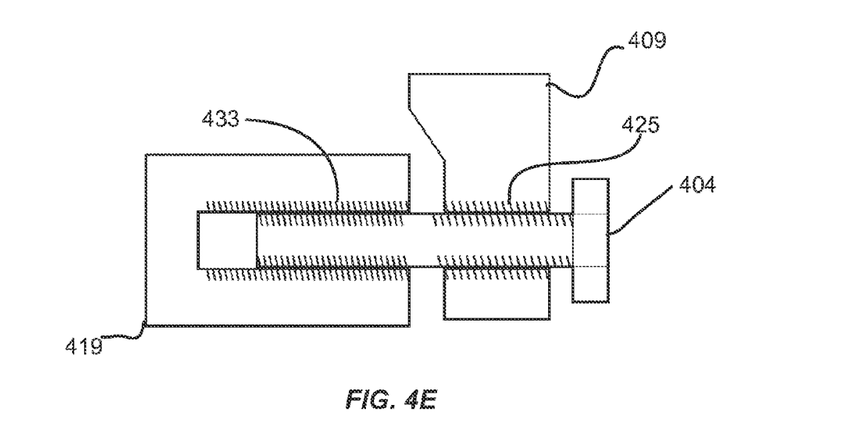
FIG. 4E is a schematic view of a portion of a positioning assembly according to an embodiment of the invention.

FIG. 4E illustrates an embodiment where the lateral adjustment screws 404 have two regions with different thread pitches. A coarser thread 425 may be used for the mating surfaces between lateral adjustment screws 404 and the outer stationary ring 409, while a finer thread pitch 433 is used for the mating surfaces of the lateral adjustment screws 404 and the adjustable support ring 419. The net effect is that the apparent thread pitch can be reduced (i.e. made smaller or finer) than either individual pitch.

Figure 4F:
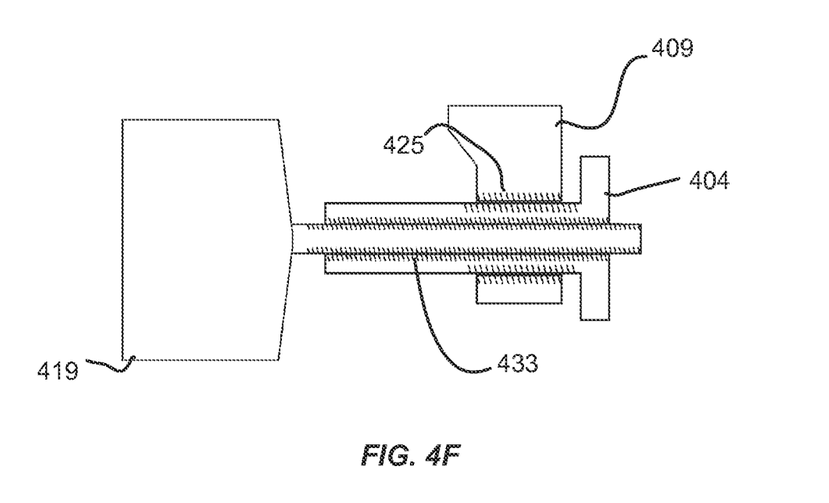
FIG. 4F is a schematic view of a portion of a positioning assembly according to an embodiment of the invention.

FIG. 4F illustrates another embodiment where a similar effect is created. The lateral adjustment screws 404 may have a bored out interior with a given thread pitch to mate with a threaded rod rigidly attached to the adjustable support ring 419. The lateral adjustment screws 404 may have a different thread pitch (shown as coarser threads 425 in FIG. 4F) on the outer surface for mating with the outer stationary ring 409 from the inner thread pitch (shown as finer threads 433) for mating with the adjustable support ring 419. Again, the net effect is that the apparent thread pitch can be finer than either individual pitch.

In any of the disclosed embodiments involving coarse and fine threads, the more similar the coarse and fine thread pitches are to one another, the finer the apparent thread pitch becomes. In the following examples, reference will be made to a thread density which is defined as the multiplicative inverse of the thread pitch. The thread pitch may be measured in inches per thread whereas the thread density may be measured in threads per inch. Thread density is commonly available in screw and bolt charts known to those of skill in the art. In some disclosed embodiments, the thread densities are 32 and 24 threads per inch which result in an apparent thread density of about 96 threads per inch. In other disclosed embodiments, the thread densities are 32 and 28 threads per inch which result in an apparent thread density of 224 threads per inch. Threads with 96 or 224 threads per inch would be more expensive to manufacture and probably not be strong enough to supply a useful force without the risk of galling.

The adjustments which are made with the tilt mechanisms and the screws disclosed in FIGS. 4A-4F and the associated discussion can be rotated manually during a continuous measurement made by the optical measurement assemblies disclosed earlier. In alternative embodiments, a discrete measurement can be made followed by an adjustment of the tilt and/or the lateral adjustment screws. This may then be followed by another measurement and adjustment as necessary. In another disclosed embodiment, the tilt and location adjustments are done automatically with feedback from the optical measurement assembly. A fully automatic closed-loop servo based adjustment of the height, tilt and/or lateral adjustment mechanisms is present in disclosed embodiments.

The vertical adjustment screws 443 and supports illustrated in FIGS. 4A-B are mechanisms for adjusting tilt and height. The upper bellows 431 accommodates the motion relating to adjustments of height, tilt and centrality of the pedestal assembly. For example, when the pedestal is raised relative to the preheat ring, the upper bellows 431 will compress. In addition to the adjustment of the vertical adjustment screws 443, height adjustments can also be made, in embodiments, with a separate motorized lift assembly.

Herein, the use of the terms "light", "optical" and "optics" does not carry any implication that the electromagnetic radiation involved must be from the visible portion of the spectrum. The light can be of any wavelength. Also herein, the use of the terms "reflecting" and "reflected" to describe the light which has illuminated the pedestal, substrate or preheat ring, does not carry any implication that the light is only reflected. The light may be scattered from a rough surface or exhibit an interference effect so that the angle of incidence does not equal the angle of departure.

Exemplary Systems

Figure 5A:
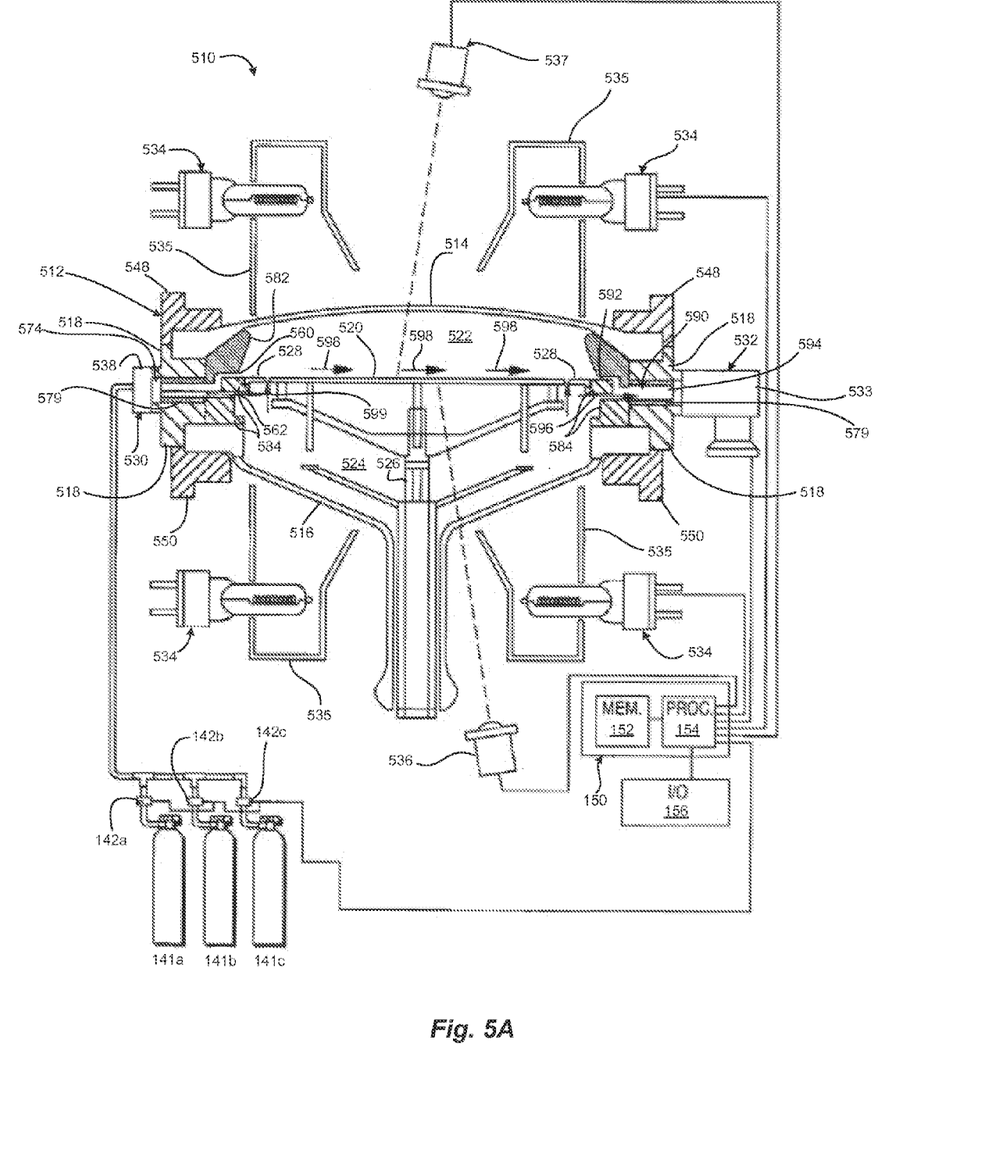
FIG. 5A is a cross-sectional view of a substrate processing system according to an embodiment of the invention.
Figure 5B:
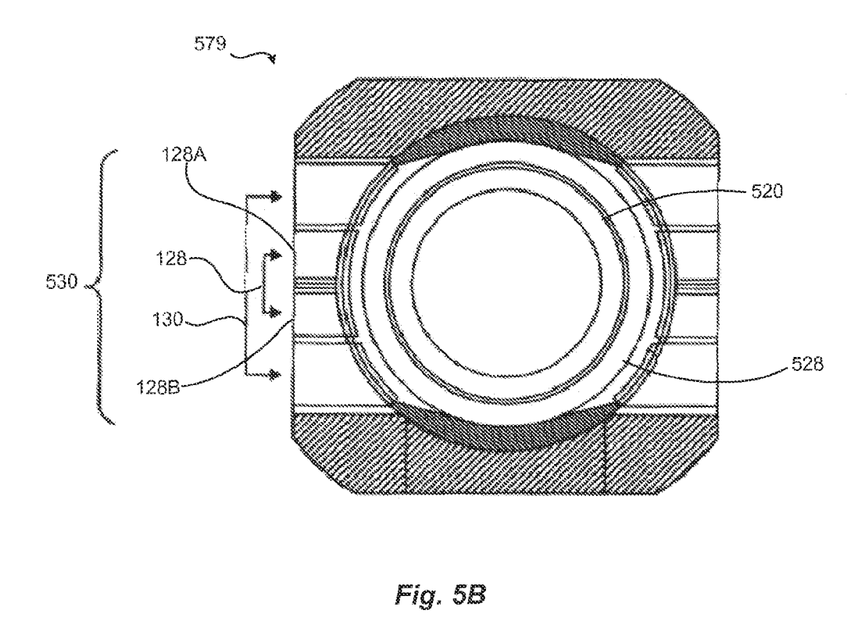
FIG. 5B is a top view of a portion of a substrate processing system according to an embodiment of the invention.

FIGS. 5A-B shows an example of a substrate processing system according to embodiments of the invention. The processing apparatus 510 shown in FIG. 5A is a deposition reactor and includes a deposition chamber 512 having an upper dome 514, a lower dome 516 and a sidewall 518 between the upper and lower domes 514 and 516. Cooling fluid (not shown) may be circulated through sidewall 518 to cool o-rings used to seal domes 514 and 516 against sidewall 518. An upper liner 582 and a lower liner 584 are mounted against the inside surface of sidewall 518. The upper and lower domes 514 and 516 are made of a transparent material to allow heating light to pass through into the deposition chamber 512.

Within the chamber 512 is a flat, circular pedestal 520 for supporting a wafer in a horizontal position. The pedestal 520 can be a susceptor or other wafer supporting structure and extends transversely across the chamber 512 at the sidewall 518 to divide the chamber 512 into an upper portion 522 above the pedestal 520 and a lower portion 524 below the pedestal 520. The pedestal 520 is mounted on a shaft 526 which extends perpendicularly downward from the center of the bottom of the pedestal 520. The shaft 526 is connected to a motor (not shown) which rotates shaft 526 and thereby rotates the pedestal 520. An annular preheat ring 528 is connected at its outer periphery to the inside periphery of lower liner 584 and extends around the pedestal 520. The preheat ring 528 occupies nearly the same plane as the pedestal 520 with the inner edge of the preheat ring 528 separated by a gap from the outer edge of the pedestal 520.

An inlet manifold 530 is positioned in the side wall 518 of chamber 512 and is adapted to admit gas from a source of gas or gases, such as tanks 141a-c, into the chamber 512. The flow of gases from bottles 141a-c is preferably independently controlled with manual valves and computer controlled flow controllers 142a-c. An outlet port 532 is positioned in the side of chamber 512 diametrically opposite the inlet manifold 530 and is adapted to exhaust gases from the deposition chamber 512.

A plurality of high intensity lamps 534 are mounted around the chamber 512 and direct their light through the upper and lower domes 514, 516 onto the pedestal 520 (and preheat ring 528) to heat the pedestal 520 (and preheat ring 528). Pedestal 520 and preheat ring 528 are made of a material, such as silicon carbide, coated graphite which is opaque to the radiation emitted from lamps 534 so that they can be heated by radiation from lamps 534. The upper and lower domes 514, 516 are made of a material which is transparent to the light from the lamps 534, such as clear quartz. The upper and lower domes 514, 516 are generally made of quartz because quartz is transparent to light of both visible and IR frequencies; it exhibits a relatively high structural strength; and it is chemically stable in the process environment of the deposition chamber 512. Although lamps are the preferred means for heating wafers in deposition chamber 512, other methods may be used such as resistance heaters and RF inductive heaters. An infrared temperature sensor 536 such as a pyrometer is mounted below the lower dome 516 and faces the bottom surface of the pedestal 520 through the lower dome 516. The temperature sensor 536 is used to monitor the temperature of the pedestal 520 by receiving infra-red radiation emitted from the pedestal 520. A temperature sensor 537 for measuring the temperature of a wafer may also be present in some disclosed embodiments.

An upper clamping ring 548 extends around the periphery of the outer surface of the upper dome 514. A lower clamping ring 550 extends around the periphery of the outer surface of the lower dome 516. The upper and lower clamping rings 548 and 550 are secured together so as to clamp the upper and lower domes 514 and 516 to the side wall 518.

Reactor 510 includes a gas inlet manifold 530 for feeding process gases into chamber 512. Gas inlet manifold 530 includes a connector cap 538, a baffle 574, an insert plate 579 positioned within sidewall 518, and a passage 560 formed between upper liner 582 and lower liner 584. Passage 560 is connected to the upper portion 522 of chamber 512. Process gas from gas cap 538 passes through baffle 574, insert plate 579 and passage 560 and into the upper portion 522 of chamber 512.

Reactor 510 also includes an independent inert gas inlet 562 for feeding an inert purge gas, such as but not limited to, hydrogen ($H_2$) and nitrogen ($N_2$), into the lower portion 524 of deposition chamber 512. As shown in FIG. 5A, inert purge gas inlet 562 can be integrated into gas inlet manifold 530, if preferred, as long as a physically separate and distinct passage 562 through baffle 574, insert plate 579, and lower liner 584 is provided for the inert gas, so that the inert purge gas can be controlled and directed independent of the process gas. Inert purge gas inlet 562 need not necessarily be integrated or positioned along with gas inlet manifold 530, and can for example be positioned on reactor 510 at an angle of 90° from deposition gas inlet manifold 530.

Reactor 510 also includes a gas outlet 532. The gas outlet 532 includes an exhaust passage 590 which extends from the upper chamber portion 522 to the outside diameter of sidewall 518. Exhaust passage 590 includes an upper passage 592 formed between upper liner 582 and lower liner 584 and which extends between the upper chamber portion 522 and the inner diameter of sidewall 518. Additionally, exhaust passage 590 includes an exhaust channel 594 formed within insert plate 579 positioned within sidewall 518. A vacuum source, such as a pump (not shown) for removing material from chamber 512 is coupled to exhaust channel 594 on the exterior of sidewall 518 by an outlet pipe 533. Thus, process gas fed into the upper chamber portion 522 is exhausted through the upper passage 592, through exhaust channel 594 and into outlet pipe 533.

The single wafer reactor shown in FIG. 5A is a "cold wall" reactor. That is, sidewall 518 and upper and lower liners 582 and 584, respectively, are at a substantially lower temperature than preheat ring 528 and pedestal 520 (and a wafer placed thereon) during processing. For example, in a process to deposit an epitaxial silicon film on a wafer, the pedestal and wafer are heated to a temperature of between 550-1200° C., while the sidewall (and liners) are at a temperature of about 400-600° C. The sidewall and liners are at a cooler temperature because they do not receive direct irradiation from lamps 534 due to reflectors 535, and because cooling fluid is circulated through sidewall 518.

Gas outlet 532 also includes a vent 596 which extends from the lower chamber portion 524 through lower liner 584 to exhaust passage 590. Vent 596 preferably intersects the upper passage 592 of exhaust passage 590 as shown in FIG. 5A. Inert purge gas is exhausted from the lower chamber portion 524 through vent 596, through a portion of upper chamber passage 592, through exhaust channel 594, and into outlet pipe 533. Vent 596 allows for the direct exhausting of purge gas from the lower chamber portion to exhaust passage 590.

According to the present invention, process gas or gases 598 are fed into the upper chamber portion 522 from gas inlet manifold 530. A process gas, according to the present invention, is defined as a gas or gas mixture which acts to remove, treat, or deposit a film on a wafer or a substrate placed in chamber 512. According to the present invention, a process gas comprising HCl and an inert gas, such as $H_2$, is used to treat a silicon surface by removing and smoothing the silicon surface. In an embodiment of the present invention a process gas is used to deposit a silicon epitaxial layer on a silicon surface of a wafer placed on pedestal 520 after the silicon surface has been treated. Process gas 598 generally includes a silicon source, such as but not limited to, monosilane, trichlorosilane, dichlorosilane, and tetrachlorosilane, methyl-silane, and a dopant gas source, such as but not limited to phosphine, diborane, germaine, and arsine, among others, as well as other process gases such as oxygen, methane, ammonia, etc. A carrier gas, such as $H_2$, is generally included in the deposition gas stream. For a process chamber with a volume of approximately 5 liters, a deposition process gas stream between 35-75 SLM (including carrier gas) is typically fed into the upper chamber portion 522 to deposit a layer of silicon on a wafer. The flow of process gas 598 is essentially a laminar flow from inlet passage 560, across preheat ring 528, across pedestal 520 (and wafer), across the opposite side of preheat ring 528, and out exhaust passage 590. The process gas is heated to a deposition or process temperature by preheat ring 528, pedestal 520, and the wafer being processed. In a process to deposit an epitaxial silicon layer on a wafer, the pedestal 520 and preheat ring 528 are heated to a temperature of between 800° C.-1200° C. A silicon epitaxial film can be formed at temperatures as low as 550° C. with silane by using a reduced deposition pressure.

Additionally, while process gas is fed into the upper chamber portion, an inert purge gas or gases 599 are fed independently into the lower chamber portion 524. An inert purge gas is defined as a gas which is substantially unreactive at process temperatures with chamber features and wafers placed in deposition chamber 512. The inert purge gas is heated by preheat ring 528 and pedestal 520 to essentially the same temperature as the process gas while in chamber 512. Inert purge gas 599 is fed into the lower chamber portion 524 at a rate which develops a positive pressure within lower chamber portion 524 with respect to the process gas pressure in the upper chamber portion 522. Process gas 598 is therefore prevented from seeping down through gap and into the lower chamber portion 524, and depositing on the backside of pedestal 520.

FIG. 5B shows a portion of the gas inlet manifold 530 which supplies gas to the upper zone of the processing chamber. The insert plate 579 of FIG. 5B is shown to be constituted by an inner zone 128 and an outer zone 130. According to this embodiment of the invention the composition of the process gas which flows into inner zone 128 can be controlled independently of the composition of the gas which flows into outer zone 130. In addition, the flow rate of the gas to either of the two halves 128a, 128b of the inner zone 128 can be further controlled independently from one another. This provides two degrees of control for the gas flow for the purposes of controlling the composition of the process gas mix over different zones of the semiconductor wafer.

Processing apparatus 510 shown in FIG. 5A includes a system controller 150 which controls various operations of apparatus 510 such as controlling gas flows, substrate temperature, and chamber pressure. In an embodiment of the present invention the system controller 150 includes a hard disk drive (memory 152), a floppy disk drive and a processor 154. The processor contains a single board computer (SBC), analog and digital input/output boards, interface boards and stepper motor controller board. Various parts of processing apparatus 510 can conform to the Versa Modular Europeans (VME) standard which defines board, card cage, and connector dimensions and types. The VME standard also defines the bus structure having a 16-bit data bus and 24-bit address bus.

System controller 150 controls all of the activities of the apparatus 510. The system controller executes system control software, which is a computer program stored in a computer-readable medium such as a memory 152. Memory 152 may be a hard disk drive, but memory 152 may also be other kinds of memory. Memory 152 may also be a combination of one or more of these kinds of memory. The computer program includes sets of instructions that dictate the timing, mixture of gases, chamber pressure, chamber temperature, lamp power levels, pedestal position, and other parameters of a particular process. Of course, other computer programs such as one stored on another memory device including, for example, a floppy disk or another appropriate drive, may also be used to operate system controller 150. An input/output device 156 such as an LCD monitor and a keyboard is used to interface between a user and system controller 150.

Figure 6:
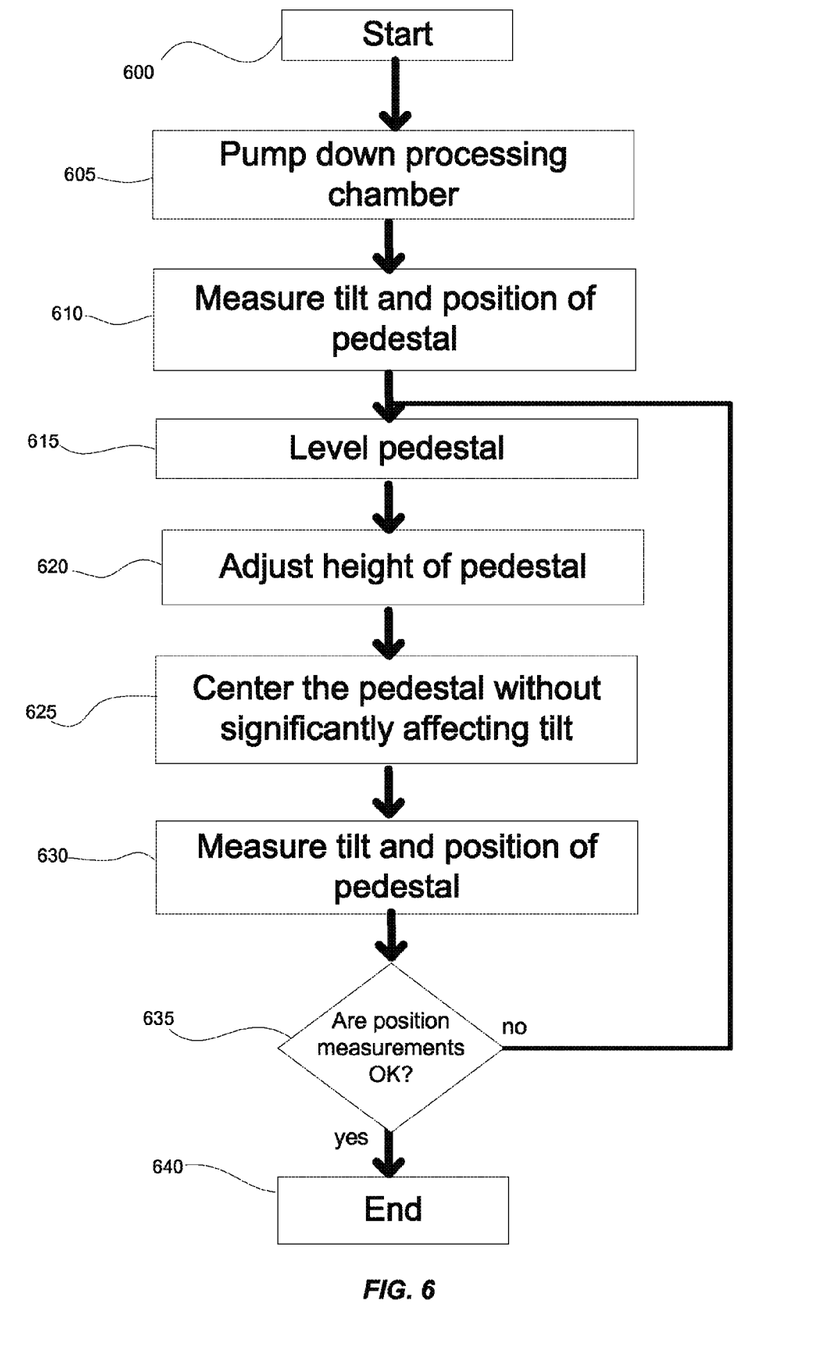
FIG. 6 is a flowchart showing the steps used to process a substrate in a substrate processing system where the pedestal has been positioned according to an embodiment of the invention.

FIG. 6 is a flowchart showing the a sequence of steps which may be used to level and adjust the location of a pedestal in a substrate processing system according to an embodiment of the invention. The process starts in 600 where the substrate processing system is prepared for processing. This can occur after the substrate processing system has been serviced or at fixed intervals where calibration of the system is normally done. In step 605, the substrate processing system is pumped down to a pressure where further pumping will not causes sufficient forces to move components within the substrate processing system. In one embodiment the substrate processing system is pumped down, with a pedestal inside, to a pressure less than 80 torr. Next in step 610, the tilt and location of the pedestal relative to a processing system reference are measured. The tilt and location are measured using the non-contact optical measurement assembly discussed above with reference to FIGS. 2A-B.

In step 615, the pedestal is leveled in response to the tilt measurement to reduce the tilt of the pedestal relative to the processing system reference. In step 620, the height of the pedestal is adjusted relative to the processing system reference. In step 625, the lateral location of the pedestal is adjusted to be at a predetermined lateral location in response to the location measurement without significantly affecting the tilt. The predetermined location can be a distance away from one or more reference points or a distance away from an object. In one embodiment the predetermined location is centering an inner ring located on the pedestal with respect to an outer ring located on the substrate processing system so that the inner ring on the pedestal lies within and concentric to the outer ring (ie. the inner ring is centered with respect to the outer ring). Next in step 630, the tilt and location of the pedestal relative to a processing system reference are measured again, as was done in step 610. In step 635, a decision is made whether the location and tilt of the pedestal is within acceptable tolerances. If the decision is that the measurements are within acceptable tolerances the process continues to step 640 where the setup of the pedestal ends and the substrate processing system can be used to process wafers. If the decision is that the measurements are not within acceptable tolerances then the process goes to step 615 and continues to step 635 leveling and adjusting the pedestal.

The process for measuring and adjusting positions in accordance with the present invention can be implemented using a computer program product which is stored in memory 152 and is executed by processor 154. The computer program code can be written in any computer readable programming language, such as, assembly language, C, C++, Pascal, Fortran, or others. Suitable program code is entered into a single file, or multiple files, using a program editor, and stored or embodied in a computer usable medium, such as a memory system of the computer. When the edited code is in a high level language, the code may be compiled, and the resultant compiled code is then linked with an object code of precompiled library routines. To execute the linked compiled object code, the system user invokes the object code, causing the computer system to load the code in memory, from which the CPU reads and executes the code to perform the tasks identified in the program. Also stored in memory 152 are process parameters such as process gas flow rates (e.g., $H_2$ and HCl flow rates), process temperatures and process pressure necessary to make measurements and adjustments in accordance with the present invention.

It will also be recognized by those skilled in the art that, while the invention has been described above in terms of preferred embodiments, it is not limited thereto. Various features and aspects of the above-described invention may be used individually or jointly. Further, although the invention has been described in the context of its implementation in a particular environment and for particular applications, those skilled in the art will recognize that its usefulness is not limited thereto and that the present invention can be utilized in any number of environments and implementations.

What is claimed is:

1. A substrate processing system, comprising:
a processing chamber;
a pedestal disposed within the processing chamber;
a lateral adjustment assembly, coupled to the pedestal and external to the processing chamber, to change a lateral centrality of the pedestal, wherein the lateral adjustment assembly comprises:
an outer ring rigidly coupled externally to the processing chamber;
three or more adjustment screws spaced nearly equally around the outer ring, wherein the three or more adjustment screws comprises bored out interiors and one or more external threaded regions, the one or more external threaded regions comprising a first external threaded region with a first thread pitch to mate the three or more adjustment screws with the outer ring;
an adjustable support ring to adjust a spacing between the pedestal and the outer ring; and
a threaded rod with a rod thread pitch to mate with the bored out interiors of the three or more adjustment screws and with the adjustable support ring, wherein the rod thread pitch is different from the first thread pitch of the first external threaded region of the three or more adjustment screws; and a vertical adjustment assembly, coupled to the pedestal and external to the processing chamber, to change a tilt of the pedestal, wherein the lateral centrality and the tilt of the pedestal are adjusted independently.

2. The substrate processing system claim 1 further comprising a reference object coupled to the processing chamber.

3. The substrate processing system of claim 2, wherein the reference object is a ring and the lateral adjustment assembly substantially centers the pedestal within the ring.

4. The substrate processing system of claim 1 wherein the pedestal is a susceptor.

5. The substrate processing system of claim 1 further comprising a bellow to maintain a pressure difference between an inside and an outside of the processing chamber while adjusting at least one of the three or more adjustment screws.

6. The substrate processing system of claim 1 further comprising a locking mechanism.

7. The substrate processing system of claim 6 wherein the locking mechanism comprises one or more set screws.

8. The substrate processing system of claim 1, wherein the rod thread pitch has a higher thread density than the first thread pitch of the first external threaded region of the three or more adjustment screws.

* * * * *